United States Patent [19]

Waldmeier

[11] 4,275,810
[45] Jun. 30, 1981

[54] PACKAGE FOR DIAMONDS AND OTHER PRECIOUS STONES

[76] Inventor: Othmar E. Waldmeier, Heuberg 12, 4001 Basel, Switzerland

[21] Appl. No.: 63,167

[22] Filed: Aug. 2, 1979

[30] Foreign Application Priority Data

Jun. 1, 1979 [CH] Switzerland .......................... 5153/79

[51] Int. Cl.³ ..................... B65D 25/54; B65D 61/00; A45C 11/16
[52] U.S. Cl. ................................ 206/45.34; 206/459; 206/216
[58] Field of Search ............... 206/45.34, 45.14, 45.19, 206/526, 0.82, 0.83, 0.84, 459, 216

[56] References Cited

U.S. PATENT DOCUMENTS

| | | | |
|---|---|---|---|
| 2,144,336 | 1/1939 | Katz | 206/45.19 |
| 3,406,821 | 10/1968 | Weissberg | 206/526 |
| 3,957,157 | 5/1976 | Therrien | 206/0.83 |
| 4,063,639 | 12/1977 | Grant | 206/0.82 |

FOREIGN PATENT DOCUMENTS 2522101 11/1976 Fed. Rep. of Germany ........ 206/45.34

*Primary Examiner*—William T. Dixson, Jr.
*Attorney, Agent, or Firm*—Karl F. Ross

[57] ABSTRACT

A package for precious stones such as diamonds comprises a two-part transparent core defining a first space receiving the precious stone and a second space receiving a data carrier such as a microfilm containing all of the information necessary for complete identification of the stone. The two-part core is held together by a two-part ring which can be separated only upon destruction of the package or the information carried thereby.

13 Claims, 3 Drawing Figures

PACKAGE FOR DIAMONDS AND OTHER PRECIOUS STONES

FIELD OF THE INVENTION

My present invention relates to a package for the secure retention of diamonds and other precious stones so as to permit trading in such stones even by nonexperts. More particularly, the invention relates to a gem-stone package facilitating commerce in gem stones and the conversion of gem stones to currency and other monetary forms.

BACKGROUND OF THE INVENTION

While commercial intercourse in gold and, in general, precious metals is widespread, a similar use of diamonds and other precious stones in commerce has been restricted because of problems intrinsic to precious stones which require an evaluation by experts at each trade, exchange or sale.

Thus, diamond speculation is much more limited than speculation in other articles of value, and banks, investment organizations and individuals have generally avoided speculation in diamonds without consultation with experts as to the value and characteristics of the stones.

Attempts have been made to overcome the disadvantage that diamonds, unlike coins, are not readily identifiable without experts, by providing the stones in plastic packages and accompanying the stones with certificates as to value, weight and quality. These efforts, however, have not been fully successful in inducing a widespread trade involving non-experts. While certificates and packages of the aforedescribed type are useful in trades involving honest individuals on all sides, this cannot be guaranteed.

Both American and German institutions have established precise guidelines for the determination of diamond values and these rules have been applied in the diamond trade but have not increased the possibility of individual investment in diamonds because of the uncertainty which accompanies any handling of items which are not readily identifiable as to quality, weight and value.

Gold, coins and like investment-grade articles can be purchased from banks, have a daily ascertainable value and can be converted widely and at practically any time into currency or other forms of investment or value in unrestricted commercial intercourse because of the identifiability of the items.

Diamonds, however, do not have this advantage although a market value can generally be ascertained for a particular quality and size of the gem stone.

Banks and investors require security, identifiability and convertibility, three characteristics which, without the intervention of experts, have not been fulfilled to date by precious stones.

OBJECTS OF THE INVENTION

It is the principal object of the present invention to provide a secure package for diamonds and other precious stones which will allow safe trading of the stones without the disadvantages enumerated above, e.g. in a manner similar to the present-day trading in gold coins.

Another object of the invention is to provide a package for diamonds and like precious stones which will afford an absolutely safe, nonforgeable identification of the contents.

SUMMARY OF THE INVENTION

These objects and others which will become apparent hereinafter are attained, in accordance with the present invention, in a package for a precious stone which comprises a two-part core of transparent material whose two parts fit together and jointly define two cavities or spaces, one of which serves to receive a precious stone such as a diamond while the other receives a data carrier, such as a microfilm, bearing all of the information necessary for complete identification of the stone. The two halves of the core are held together by a body which is not readily destructible but, if treated so as to enable separation of the two parts of the core, provides visible evidence of the separation.

According to a more particular feature of my invention, the body surrounding the core consists of two hard-metal rings which are connected inseparably with one another, e.g. by a screw thread designed so that when the rings are tightened together to clamp the two parts of the core, they undergo cold welding to form the inseparable bond.

According to another feature of the invention, one of the hard-metal rings, in the region of the interface or junction between them, is formed with an annular groove receiving a sound-recording material which can be provided with information matching the information of the data carrier and confidential information characteristic of the preparer of the package so that a fraudulent package can be readily discovered upon monitoring of the information on the completely concealed acoustic recording medium. Furthermore, the acoustic recording medium can be held in the groove so that any separation of the two rings will disturb the material and destroy or disturb the information recorded therein.

According to a further feature of my invention, one or both of the hard-metal rings can be provided with an electronic control circuit having a terminal which can be connected to a monitoring or reading device so that the circuit can provide indicia of the contents or information matching that on the data carrier and/or the sound-recording medium. The electronic circuit can, for example, be an oscillator generating a characteristic frequency ascertainable upon connection to the terminals or, for example, a microcomputer or ROM storing a large number of bids as indicia which facilitate identification.

Yet another feature of the present invention resides in providing the aforementioned body, e.g. one or both of the rings, with one or more recesses for indexing same in a control device, i.e. in a system for reading the stored information. The two-part core can consist of sapphire glass and can define an annular groove between the parts which can receive a silicone sealing ring hermetically sealing the two spaces. The hollow space for receiving the stone is advantageously conical while the monitoring contacts or terminals for the electronic circuit are preferably gold contacts set into sapphire to minimize wear even with repeated monitoring of the package. Naturally, one of the hard-metal rings can also be engraved with the information required to identify the stone so that the identification will be readily apparent to any individual having possession of the package.

BRIEF DESCRIPTION OF THE DRAWING

The above and other features of my invention will become more readily apparent from the following description, reference being made to the accompanying drawing in which.

SPECIFIC DESCRIPTION

Figure 1:
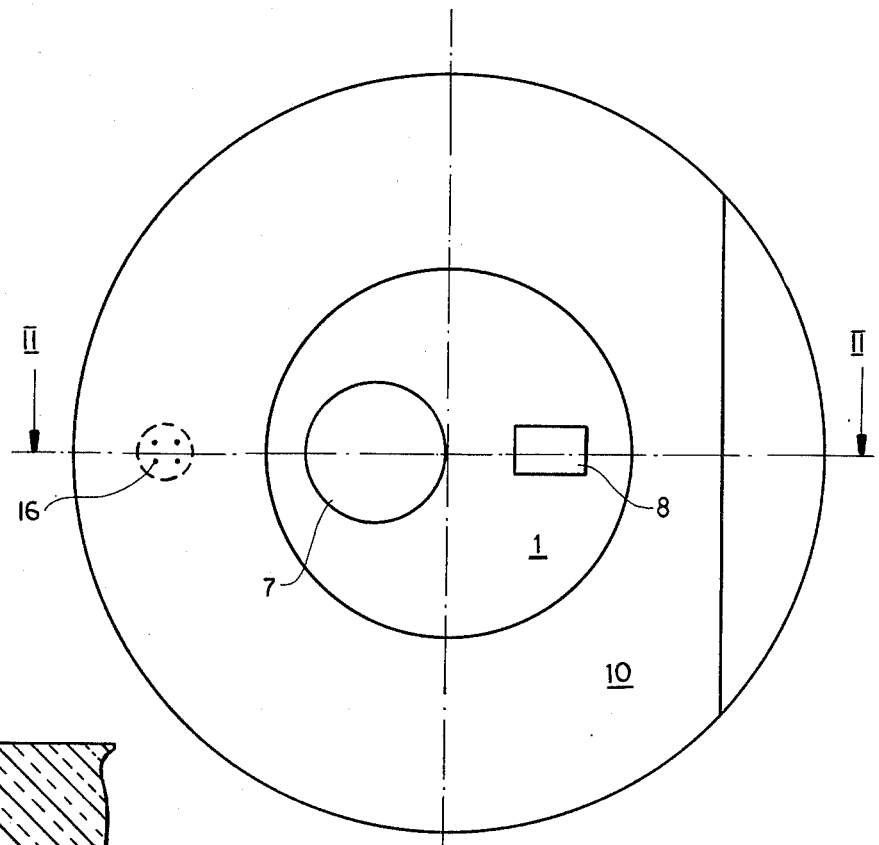
FIG. 1 is a plan view of the package according to the present invention.
Figure 3:
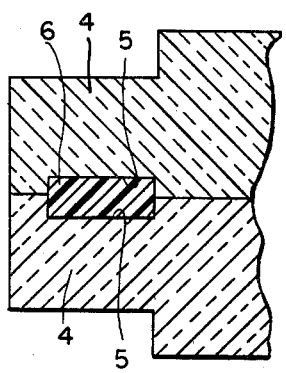
FIG. 3 is a detail view of a portion of the core of the package.

As can be seen from the drawing, the package embodying my invention basically comprises a core of transparent material, in which a precious stone and a data carrier can be received, and a body which surrounds this core and holds the parts thereof together, this body being composed of a material which is difficult to destroy.

The core 1 comprises two disks 2, 3 composed of sapphire glass, each disk having annular lips 4 which are provided with precisely registering annular grooves 5 together defining a space for a silicone sealing ring 6.

Figure 2:
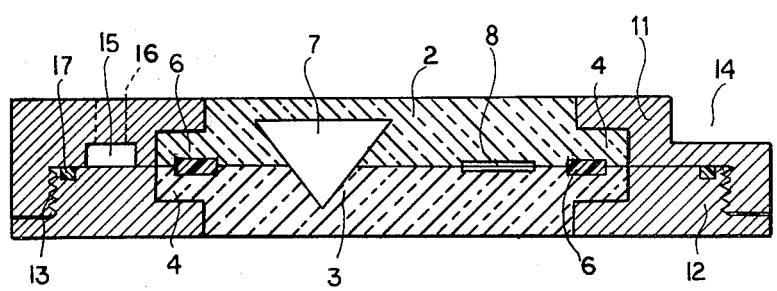
FIG. 2 is a cross-sectional view taken along the line II—II of FIG. 1.

The two disks, when pressed together as shown in FIG. 2, define a conical space 7 forming a hermetically sealed chamber adapted to receive the diamond or other precious stone to be encased. A second space 8 receives a data carrier which contains all the information required to identify the stone enclosed in the core.

Advantageously, the data carrier is a microfilm which carries information such as a description of the stone including its weight, its color, its brilliance, other indicia of quality, its polish and cut, and a gem print or other "fingerprint" identification of the stone. Any commercial quality indicia or data as to source may also be provided.

It is advantageous to provide gem prints of the type developed by S. Shtrikman, an Israeli physicist, using an apparatus of the type manufactured by Kulso Ltd. whereby a helium-neon laser projects a beam through a facet of the diamond with the light being reflected at various angles. The result is an image of points which can be recorded as an instantaneous image by a camera. This image has been found to be as characteristic of a diamond as a fingerprint is of an individual and hence may be included as the sole identifying data or as a portion thereof.

Naturally, an electronic or other data carrier can be provided in the space 8, preferably carrying the same information as has been enumerated above.

The part 10 of a material which is difficult to destroy comprises two hard-metal clamping rings 11 and 12 which are screwed together. The core 1 is gripped by inwardly extending flanges of the rings 11 and 12 overhanging the lips 4 mentioned previously. The permanent bond is formed by a low-pitch screw thread 13 with the two rings tightened together until cold welding occurs in the region of the thread, thereby preventing the rings from being separated. Naturally, other means can be used to secure the rings permanently together in addition to or separate from the cold welding, e.g. deposition or fusion welding, cementing or hard soldering.

The rings 11 and 12 contain additional information in storage means and control devices which are intended primarily for the dealers distributing or making a market in the packaged stones although the information may also be convenient for the purchaser. To read out the information for control purposes or to change or initially supply the information, peripheral equipment is required which does not form part of the invention and, apart from its application to the packages of the present invention, is conventional. The upper ring 11 has a recess 14 which serves to index the package in a peripheral apparatus for readout or data insertion. Naturally, such recesses can be provided on either or both rings.

Of course, the dimensions of the recess can be varied to provide some indication of the contents of the package, e.g. the type of gem stone.

An integrated electronic circuit 15 is mounted in the upper ring 11 and is connectible by terminals 16 therein to the peripheral equipment. An appropriate circuit can be an oscillator whose frequency must correspond to a coded frequency on the microfilm. The recess 14 guarantees the exact positioning of the package in the peripheral for determining the frequency.

Instead of a simple frequency-selection circuit, member 15 can represent a microcomputer or a memory, usually a PROM, wherein several thousand bits of information can be stored and which can be read via the terminals 16. To ensure an enduring useful life of the terminals, they can comprise gold pins which are mounted in a sapphire support. Optimum physical and electronic characteristics and higher long-life insulation between the terminals is therefore insured.

The lower ring 12 is provided in the region of the thread 13 with an annular groove 17 in which iron oxide is placed to act as a sound-storage medium. I have found that a storage ring can retain up to 40,000 bits of information which can be related to the purchase site or other confidential or internal bank data which, when tampered with or not present, can signal a forgery. Naturally, this ring of sound-recording material can carry coded information which must correspond to data on the microfilm. Security with the package of the present invention is thus guaranteed in a manifold manner.

The precious stone is fully protected and replacement of the stone can only occur by destroying the body. Destruction of the body will, however, destroy various data carriers or coded information and hence the replacement will be readily signaled.

Control of the data carrier requires special pheripheral equipment without which the coded data cannot be read and hence falsification of the package is exceptionally expensive and will require confidential bank information not readily accessible to an outsider.

Furthermore, it is possible to conceive of a computer with terminals at all of the diamond markets or brokerage sites so that each purchaser of each diamond will be centrally identified and the information stored at the diamond center.

The buyer, without special means, can readily see what he has purchased and can identify it from engraving on the lower ring 12 which can identify the nature of the stone, the color and the weight.

I claim:

1. A secure package for storing a precious stone, comprising:

a two-part transparent core formed from a pair of disks defining between them a chamber for receiving a precious stone and a space for receiving a data carrier identifying said stone;

an annular body of a material difficult to destroy surrounding said core and holding the parts thereof together, said body being formed from a pair of hard-metal rings secured inseparably together along a contact surface and holding said disks against one another, one of said rings having an annular groove at said contact surface; and sound-recording material received in said groove and provided with coded information relating to the stone in said chamber.

2. A secure package for storing a precious stone, comprising:

a two-part transparent core formed from a pair of disks defining between them a chamber for receiving a precious stone and a space for receiving a data carrier identifying said stone; and an annular body of a material difficult to destroy surrounding said core and holding the parts thereof together, said body being formed from a pair of hard-metal rings secured inseparably together and holding said disks against one another, at least one of said rings being provided with an electronic package-identifying circuit and terminals connected to said circuit.

3. The package defined in claim 1 or 2, further comprising a screw thread interconnecting said rings, said rings being cold welded at said screw thread.

4. The package defined in claim 2 wherein one of said rings is formed with an annular groove at a contact surface between said rings, further comprising sound-recording material received in said groove and provided with coded information relating to the stone in said chamber.

5. The package defined in claim 1 or 2 wherein said body is formed with a recess for indexing the package in peripheral equipment.

6. The package defined in claim 1 or 2 wherein said disks are composed of sapphire glass.

7. The package defined in claim 1 or 2 wherein said disks are formed with confronting grooves open toward each other and occupied by a silicone sealing ring.

8. The package defined in claim 1 or 4 wherein said circuit includes a frequency-determining network for an oscillator.

9. The package defined in claim 2 or 4 wherein said circuit includes a microcomputer store.

10. The package defined in claim 1 or 2 wherein said chamber is conical.

11. The package defined in claim 1 or 2, further comprising a microfilm forming said data carrier in said space.

12. The package defined in claim 1 or 4 wherein said terminals are gold contacts set in sapphire.

13. The package defined in claim 1 or 2 wherein one of said rings is engraved with information identifying said stone.

* * * * *